United States Patent [19]

Fryd et al.

[11] Patent Number: 5,077,175

[45] Date of Patent: * Dec. 31, 1991

[54] PLASTICIZED POLYVINYL ALCOHOL RELEASE LAYER FOR A FLEXOGRAPHIC PRINTING PLATE

[75] Inventors: Michael Fryd, Moorestown, N.J.; Ernst Leberzammer, Glen Mills, Pa.; David W. Swatton, N. Middletown, N.J.

[73] Assignee: E. I. Du Pont de Nemours and Company, Wilmington, Del.

[*] Notice: The portion of the term of this patent subsequent to Sep. 11, 2007 has been disclaimed.

[21] Appl. No.: 478,381

[22] Filed: Feb. 12, 1990

Related U.S. Application Data

[62] Division of Ser. No. 238,103, Aug. 30, 1988, abandoned.

[51] Int. Cl.$^5$ ............................. G03F 7/11; G03F 7/32
[52] U.S. Cl. ..................................... 430/273; 430/271; 430/325
[58] Field of Search ......................... 430/273, 271, 325

[56] References Cited

U.S. PATENT DOCUMENTS

| | | | |
|---|---|---|---|
| 2,306,790 | 12/1942 | Meigs | 260/23 |
| 2,340,866 | 2/1944 | Dangelmajer | 260/8 |
| 2,395,616 | 2/1946 | Dangelmajer | 260/36 |
| 2,408,377 | 10/1946 | Dangelmajer | 260/36 |
| 2,419,281 | 4/1947 | Noble | 260/90 |
| 4,156,047 | 5/1979 | Wysong | 428/220 |
| 4,318,975 | 3/1982 | Kuznetsov et al. | 430/273 X |
| 4,440,830 | 4/1984 | Wempe | 428/352 |
| 4,576,897 | 3/1986 | Fujikawa et al. | 430/273 |
| 4,672,021 | 6/1987 | Blumel jet al. | 430/192 X |

Primary Examiner—Cynthia Hamilton
Attorney, Agent, or Firm—Lynne M. Christenbury

[57] ABSTRACT

The present invention concerns a plasticized polyvinyl alcohol release composition for an aqueous or semi-aqueous processible flexographic printing plate comprising:

(a) at least 60% of a substantially hydrolyzed polyvinyl alcohol based on the total weight of the release composition; and
(b) at least 8% plasticizer, based on the total weight of the release composition.

This invention also concerns aqueous or semi-aqueous processible flexographic photosensitive elements containing this plasticized polyvinyl alcohol release layer and to processes for making printing reliefs from such elements.

5 Claims, No Drawings

PLASTICIZED POLYVINYL ALCOHOL RELEASE LAYER FOR A FLEXOGRAPHIC PRINTING PLATE

This is a division of application Ser. No. 07/238,103, filed Aug. 30, 1988, now abandoned.

FIELD OF THE INVENTION

This invention relates to release layers for flexographic printing plates and, more particularly, to polyvinyl alcohol release layers for aqueous or semi-aqueous processible flexographic printing plates.

BACKGROUND OF THE INVENTION

Release layers facilitate removal of a negative or positive image-bearing film from a flexographic printing element after the element has been imagewise exposed through the negative or positive film.

U.S. Pat. No. 4,576,897 discloses applying a release layer to an alcohol-soluble or water-soluble photosensitive polyamide composition wherein the release layer comprises a polymer which is soluble or dispersible in a developer for the photosensitive polyamide composition. Polyvinyl alcohol is mentioned as a suitable component for a release layer to be applied to a water-soluble photosensitive polyamide composition. No other additives, such as a plasticizer, are used in preparing the release layer. In fact, it is mentioned specifically that the reason the release layer works so well is that such additives are not used.

Release layers can be applied in a variety of ways. For example, the release layer can be coated onto a cover sheet which can then be laminated on the surface of the photosensitive printing element. Another option is to extrude the photosensitive composition between a cover sheet containing the release layer and a support. The release layer remains on the surface of the photosensitive composition when the cover sheet is removed.

The problem with a polyvinyl alcohol release layer, such as that taught above, is that it wrinkles when the cover sheet is removed. These wrinkles are visible on the surface and appear as grooves in the resulting image after the photosensitive element has been imagewise exposed and developed.

It is believed that no one heretofore has produced an aqueous or semi-aqueous processible release layer which does not wrinkle on the surface of the photosensitive composition of an aqueous or semi-aqueous processible flexographic printing element after the cover sheet has been removed.

SUMMARY OF THE INVENTION

The present invention concerns a plasticized polyvinyl alcohol release composition for an aqueous or semi-aqueous processible flexographic printing plate comprising:

(a) at least 60% of a substantially hydrolyzed polyvinyl alcohol based on the total weight of the release composition; and (b) at least 8% plasticizer, based on the total weight of the release composition.

This invention also concerns aqueous or semi-aqueous processible flexographic photosensitive elements containing this plasticized polyvinyl alcohol release layer and to processes for making printing reliefs from such elements.

DETAILED DESCRIPTION OF THE INVENTION

An important component of the release composition is the polymer which must be processible in an aqueous or semi-aqueous development system. It has been found that a substantially hydrolyzed polyvinyl alcohol works well. The polyvinyl alcohol should be hydrolyzed at least 75% and, more preferably, at least 80%. It is possible to work with a fully hydrolyzed polyvinyl alcohol. However, it is less desirable because it would be less soluble in water due to the absence of any acetate groups and, thus, may take longer to be removed from the plate surface during development.

Usually, at least 60% substantially hydrolyzed polyvinyl alcohol should be present based on the total weight of the release composition. Preferably, at least 70% should be present and, most preferably, at least 80% should be present.

An important feature of the release composition of this invention is that it contains a plasticizer. For example, a low molecular weight polyethylene glycol, urea, sorbitol and glycerine can be used. The preferred plasticizer for practicing the invention is a low molecular weight polyethylene glycol having an average molecular weight in the range 200-5000. Examples of such materials include Carbowax ® 400 and 1000 manufactured by Union Carbide.

Usually, at least 8% plasticizer is used based on the total weight of the release composition. Preferably, at least 14% plasticizer should be present.

It is believed that the plasticizer reduces the stiffness of the polyvinyl alcohol so that the plasticized polyvinyl alcohol does not wrinkle when the cover sheet is removed. Furthermore, this plasticized release composition provides good release from the transparency through which it is imagewise exposed and the release composition of this invention can be quickly removed by an aqueous or semi-aqueous developer because it is designed to be processible in aqueous or semi-aqueous systems.

Optionally, a surfactant can be added to the plasticized release composition in order to improve coating/wetting of the plasticized release composition on the flexible cover sheet. Any surfactant can be used as long as it is processible in an aqueous system. There can be mentioned fluorinated surfactants, such as, perfluoroalkyl ethoxylate. Usually, at least 1.0% of surfactant should be present based on the total weight of the release composition. Preferably, at least 1.5% of surfactant should be present.

In general, an aqueous or semi-aqueous processible flexographic element comprises a support, a layer of a photosensitive composition, said composition comprising an aqueous or semi-aqueous processible binder, at least one addition polymerizable ethylenically unsaturated monomer, an initiator or initiating system activated by actinic radiation and a flexible cover sheet.

The plasticized polyvinyl alcohol release composition can be applied on top of the photosensitive composition in a variety of ways. The preferred method is to bar coat a thin layer onto the side of the flexible cover sheet which contacts the photosensitive composition layer. The plasticized release layer has a dry coating weight in the range 10 mg/dm$^2$ to 80 mg/dm$^2$. The photosensitive composition can then be extruded between the cover sheet coated with the plasticized release composition and a support. When the cover sheet is removed, the plasticized release layer remains on the surface of the photosensitive layer and a smooth surface is exhibited.

The photopolymerizable layers described herein may be applied to a wide variety of substrates. By substrate is meant any natural or synthetic support. For example, suitable base or support materials include metals, e.g., steel and aluminum plates, sheets and foils, and films or plates composed of various film-forming synthetic resins or high polymers, such as the addition polymers and in particular vinylidene chloride copolymers with vinyl chloride, vinyl acetate, styrene, isobutylene and acrylonitrile; vinyl chloride homopolymers and copolymers with vinyl acetate, styrene, isobutylene and copolymers with vinyl acetate, styrene, isobutylene and acrylonitrile; linear condensation polymers such as polyesters, e.g., polyethylene terephthalate, polyamide, e.g., polyhexamethylenesebacamide; polyimides, e.g., films as disclosed in assignee's Edwards, U.S. Pat. No. 3,179,634 and polyester amide, e.g., polyhexamethylenedipamide adipate. Fillers or reinforcing agents can be present in the synthetic resin or polymer basis such as the various fibers (synthetic modified, or natural), e.g., cellulosic fibers, for instance, cotton, cellulose acetate, viscose rayon, paper; glass wool; nylon and polyethylene terephthalate. These reinforced bases may be used in laminated form. Various anchor layers disclosed in U.S. Pat. No. 2,760,863 can be used to give strong adherence between the support and the photosensitive layer or, in the case of transparent support, pre-exposure through the support to actinic radiation may be useful. The adhesive compositions disclosed in assignee's Burg, U.S. Pat. No. 3,036,913, are also effective.

Photopolymer compositions suitable for use in this invention should be developable in water or aqueous or semi-aqueous alkali. The photopolymer compositions comprise a preformed macromolecular polymeric binder, at least one addition polymerizable ethylenically unsaturated monomer, and an initiating system. Photosensitive compositions such as those taught in Alles U.S. Pat. No. 3,458,311, Pohl, U.S. Pat. No. 4,442,302, Pine, U.S. Pat. No. 4,361,640, Kai et al., U.S. Pat. No. 3,794,494, Proskow et al., U.S. Pat. Nos. 4,177,074, 4,431,723 and 4,272,608 and Worns, U.S. Pat. No. 4,517,279, all of which are hereby incorporated by reference, are suitable for use in practicing the present invention.

In addition to the photopolymer compositions mentioned above, photopolymer compositions using binders consisting of a blend of a preformed macromolecular polymer and a core shell microgel such as those described in applicant's assignee's copending patent application filed concurrently herewith, Ser. No. 07-238,104, now U.S. Pat. No. 4,956,252 filing date Aug. 30, 1988, attorney docket number IM-0172, incorporated herein by reference. The term microgel means a particle having two domains--a crosslinked core and an aqueous processible non-crosslinked shell. The core should have less than 10% crosslinking and the shell consists of an acid-modified copolymer which is not crosslinked.

Core shell microgels are conventionally prepared by emulsion polymerization. The microgels are generally formed from 90 to 99.5% by weight polymer component and 10 to 0.5% by weight crosslinking agent with these materials compatible in formation of a continous phase system. Generally, the microgels will be present in an average particle size range of from 0.01 to 1 microns and more preferably 0.05 to 0.15 microns. The polymer components can be varied during polymerization to produce core and shell microgel so that the core has less than 10% crosslinking and the shell is designed for aqueous processibility in that an acid-modified copolymer is used to make the shell. Typically, the microgels used in this invention have elastomeric crosslinked cores and aqueous processible elastomeric non-crosslinked shells or a thermoplastic non-crosslinked shell. Elastomers, by definition, have glass transition temperatures below room temperature and thermoplastic materials, by definition, have glass transition temperatures above room temperature. It is also possible to use a microgel having a thermoplastic crosslinked core and a thermoplastic non-crosslinked shell. The choice will depend upon the use to which the photosensitive composition is to be put. Elastomeric cores and elastomeric shells are preferred for making flexographic printing reliefs, whereas thermoplastic cores and thermoplastic shells are preferred for making letterpress plates and photoresists from which printed circuit boards can be made.

Core shell microgels can be made from a wide variety of starting materials. Conventionally monoethylenically unsaturated monomers are used in preparing the bulk portion of the microgel, whereas the crosslinking agents contain at least two double bonds.

Suitable monomers are esters of acrylic and methacrylic acid with $C_1$-$C_{18}$ alcohols. There can be mentioned methyl methacrylate, ethyl acrylate, methacrylic acid, butyl methacrylate, ethyl methacrylate, glycidyl methacrylate, styrene and allyl methacrylate, while other useful monomers include acrylonitrile, methacrylonitrile, acrylic acid, butadiene and 2-ethyl-hexyl acrylate. The preferred monomer for making the core is 2-ethyl-hexyl acrylate. The preferred acid-modified copolymer for the shell is a methacrylic acid-modified n-butyl acrylate.

Other suitable monomers include vinyl ethers and vinyl esters, nitriles and amides of acrylic and methacrylic acid.

A preferred crosslinking agent is butanediol diacrylate (BDDA); while others include ethylene glycol dimethacrylate, tetramethylene glycol diacrylate, trimethylol propane triacrylate, tetraethylene glycol dimethacrylate, methylene bisacrylamide, methylene bismethacrylamide, divinyl benzene, vinyl methacrylate, vinyl crotonate, vinyl acrylate, vinyl acrtylene, trivinyl benzene, glycerine trimethacrylate, pentaerythritol tetramethacrylate, triallyl cyanurate, divinyl acetylene, divinyl ethane, divinyl sulfide, divinyl sulfone, hexatriene, triethylene glycol dimethacrylate, diallyl cyanamide, glycol diacrylate, ethylene glycol divinyl ether, diallylphthalate, divinyl dimethyl silane, glycerol trivinyl ether and the like.

As was mentioned previously, crosslinking is controlled during manufacture. Thus, the synthesis of core shell microgels having cores with less than 10% crosslinking is accomplished by using 10% or less of the crosslinking agent to crosslink the core, i.e., no crosslinking agent is used to make the shell.

Conventionally one or more monomers and crosslinking agents are dispersed in water with suitable emulsifiers and initiators in manufacture of the microgel. Conventional anionic, cationic or nonionic emulsifiers and water soluble initiators can be employed. Examples of emulsifying agents are sodium lauryl sulfate, lauryl pyridine chloride, polyoxyethylene, polyoxypropylene, colloidal silica, anionic organic phosphates, magnesium montmorillonite, the reaction product of 12 to 13 moles of ethylene oxide with 1 mole of octyl phenol, secondary sodium alkyl sulfates and mixtures thereof. Usually from 0.25 to 4% of emulsifier based on the total weight of reactants is used. Examples of initiators are potassium persulfate, sodium persulfate, ammonium persulfate, tertiary butyl hydroperoxide, hydrogen peroxide, azo bis(isobutyronitrile), azo bis(isobutyroimidine hydrochloride), various redox (reduction-oxidation) systems such as hydrogen peroxide and ferrous sulfate and well known persulfate-bisulfate combinations. Usually from 0.05 to 5% by weight of initiator based on the weight of copolymerizable monomers is used.

Microgels suitable for the practice of the present invention can be produced by the technique of emulsion polymerization as described in U.S. Pat. No. 3,895,082 (Also, British Pat. No. 967,051 teaches a suitable method.) This technique can also be modified by beginning the reaction with one set of monomers and by varying the ratios for the final part of the reaction in order to produce spherical microgels in which the part of the polymer, i.e., the core is different monomeric composition than the outer part of the polymer, i.e., shell. It is also desired that the shell be designed for aqueous processibility. This is achieved by constructing the shell so that it has an acid-modified copolymer. In the most preferred embodiment, both the core and the shell are elastomeric.

The art of emulsion polymerization is well known concerning reaction conditions to produce spherical microgels dispersed in a water phase. Unless the dispersion can be used as made and contain no objectionable impurities or byproducts, it is usually necessary to convert the microgels to a solid prior to their use as a photosensitive composition. Well-known techniques of coagulation, filtration, washing and drying may be employed for this purpose. Freeze drying is a particularly useful method for the present invention. Generally the amount of crosslinking agent in the microgel will be less than 20% by weight of the overall weight of the microgel and generally less than 10% by weight.

The weight ratio of the core to the shell is usually in the range from about 4:1 to about 1:4.

Compositions of some of the microgels produced and tested and found useful for the practice of the present invention are set forth in Table 1. All parts are by weight.

TABLE I

| Core*/Shell Microgel | 2-EHA | BD | BDDA | MMA | nBA | MAA | EA | AA | Core/Shell Weight Ratio |
|---|---|---|---|---|---|---|---|---|---|
| A Core | 98.5 | — | 0.5 | — | — | — | — | — | A Core/A Shell |
| A Shell[1] | — | — | — | 51 | — | 20 | 29 | — | 2:1 |
| B Core | 98.5 | — | 0.5 | — | — | — | — | — | B Core/B Shell |
| B Shell | — | — | — | — | 80 | 20 | — | — | 2:1 |
| C Core | 98 | — | 1.0 | — | — | — | — | — | C Core/C Shell |
| C Shell | — | — | — | — | 80 | 20 | — | — | 2:1 |
| D Core | — | 100 | — | — | — | — | — | — | D Core/D Shell |
| D Shell | — | — | — | — | 80 | 20 | — | — | 2:1 |
| E Core | — | 100 | — | — | — | — | — | — | E Core/E Shell |
| E Shell | — | — | — | — | 80 | 20 | — | — | 1:1 |
| F Core | 98 | — | 1.0 | — | — | — | — | — | F Core/F Shell |
| F Shell | — | — | — | — | 80 | — | — | 20 | 2:1 |
| G Core | 97 | — | 2.0 | — | — | — | — | — | G Core/G Shell |
| G Shell | — | — | — | — | 80 | 20 | — | — | 2:1 |
| H Core | 98 | — | 1.0 | — | — | — | — | — | H Core/H Shell |
| H Shell | — | — | — | — | 80 | — | — | 20 | 1:1 |
| I Core | 98 | — | 1.0 | — | — | — | — | — | I Core/I Shell |
| I Shell | — | — | — | — | 80 | 20 | — | — | 1:1 |
| J Core | 98 | — | 1.0 | — | — | — | — | — | J Core/J Shell |
| J Shell | — | — | — | — | 70 | 30 | — | — | 2:1 |
| K Core | 98 | — | 1.0 | — | — | — | — | — | K Core/K Shell |
| K Shell | 80 | — | — | — | — | 20 | — | — | 2:1 |
| L Core | — | — | 1.0 | — | 98 | — | — | — | L Core/L Shell |
| L Shell | — | — | — | — | 80 | 20 | — | — | 2:1 |
| M Core | 98 | — | 1.0 | — | — | — | — | — | M Core/M Shell |
| M Shell | — | — | — | — | 80 | 20 | — | — | 1:2 |
| N Core | 98 | — | 1.0 | — | — | — | — | — | N Core/N Shell |
| N Shell | — | — | — | — | 80 | 20 | — | — | 1:4 |
| O Core | 98 | — | 1.0 | — | — | — | — | — | O Core/O Shell |
| O Shell | — | — | — | — | 87 | 13 | — | — | 1:1 |

BDDA = butanediol diacrylate
2-EHA = 2-ethylhexyl acrylate
MMA = methyl methacrylate
EA = ethyl acrylate
nBA = n-butyl acrylate
AA = acrylic acid
MAA = methacrylic acid
* = All cores also contained 1% allyl methacrylate (AMA), except D and E.
1 = This is a thermoplastic shell. Shells B–O are elastomeric.

Generally, the microgel will be present in an amount from 1 to 90% by weight of the components monomer, initiating system, and microgel.

An example of suitable concentrations by weight in a photosensitive composition based on these constituents is:

(a) from 5% to 50% of an addition polymerizable ethylenically unsaturated monomer;
(b) from 0.01% to 15% of an initiating system activated by actinic radiation;
(c) from 1% to 90% by weight of a core shell microgel; and
(d) from 0% to 90% of a preformed macromolecular polymer.

Preformed macromolecular polymer should contain sufficient acidic or other groups so that the binder is also processible in a semi-aqueous or aqueous developer. Useful aqueous-processible binders include those disclosed in U.S. Pat. No. 3,458,311 and in U.S. Pat. No. 4,273,857. Useful amphoteric polymers include interpolymers derived from N-alkylacrylamides or methacrylamides, acidic film-forming comonomer and an alkyl or hydroxyalkyl acrylate such as those disclosed in U.S. Pat. No. 4,293,635. For aqueous development, those portions of the photosensitive layer which have not been exposed to radiation will be removed during development by a liquid such as wholly aqueous solutions containing 2% sodium carbonate by weight. The exposed portions will not be affected by development.

If a plasticizer is needed, it can be any one of the common plasticizers compatible with the microgel binder. Some of the common plasticizers which can be used are dialkyl phthalates, alkyl phosphates, polyethylene glycol, polyethylene glycol esters, polyethylene glycol ethers, and low molecular weight polybutadienes (MW<5000).

When a blend of a core shell microgel and a preformed macromolecular polymer is used, it is preferred that the addition polymerizable ethylenically unsaturated monomer should partition outside the core of the microgel. Suitable monomers can be selected, generally, which have chemical compositions similar to the chemical composition of the aqueous processible outer shell. One class of suitable ethylenically unsaturated esters of alcohols. The following can also be mentioned: trimethylolpropane triacrylate, polyoxyethylated trimethylolpropane triacrylate.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydro-naphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; alpha-hydrocarbon-substituted aromatic acyloins, including alpha-methylbenzoin, alpha-benzoin and alphaphenylbenzoin. Photoreducible dyes and reducing agents disclosed in U.S. Pat. Nos. 2,850,445; 2,875,047; 3,097,096; 3,074,974; 3,097,097; and 3,145,104, as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos. 3,427,161; 3,479,185; and 3,549,367 can be used as initiators. Similarly the cyclohexadienone compounds of U.S. Pat. No. 4,341,860 are useful as initiators. Also useful with photoinitiators and photoinhibitors are sensitizers disclosed in U.S. Pat. No. 4,162,162.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

A transparent cover sheet such as a thin film of polystyrene, polyethylene, polypropylene or other strippable material is generally present on top of the release layer to prevent contamination or damage during storage or manipulation.

In general, the process of preparing a flexographic printing plate from a photopolymer element includes the steps of main image exposure, development or washout, post-development treatment which includes drying, and post-exposure. Detackification is an optional post-development treatment which can be applied if the surface is still tacky.

A backflash exposure may be used with elements having a transparent support. Backflash generally uses a radiation source emitting a principal wavelength around 360 nm. It serves to sensitize the plate and establishes the depth of the plate relief. The backflash procedure gives the photopolymer layer a uniform and relatively short exposure through the support, thereby photocrosslinking binder and monomer in the support region.

Printing reliefs can be made from a photosensitive composition of this invention by exposing to actinic radiation selected portions of a photosensitive layer through an image-bearing transparency. During the addition-polymerization or cross-linking, the ethylenically unsaturated compound composition is converted to the insoluble state in the radiation-exposed portions of the layer, with no significant polymerization or cross-linking taking place in the unexposed portions or areas of the layer. The unexposed portions of the layer are removed by means of an aqueous or semi-aqueous solvent. The process transparency may be constructed of any suitable material including cellulose acetate film and oriented polyester film.

Actinic radiation from any source and of any type can be used in the photopolymerization process. The radiation may emanate from point sources or be in the form of parallel rays or divergent beams. By using a broad radiation source relatively close to the image-bearing transparency, the radiation passing through the clear areas of the transparency enters as divergent beams and thus irradiates a continually diverging area in the photopolymerizable layer underneath the clear portions of the transparency. This results in a polymeric relief having its greatest width at the bottom of the photopolymerizable layer, i.e., a frustrum, the top surface of the relief being the dimensions of the clear area.

Inasmuch as the free-radical generating systems activatable by actinic radiation generally exhibit their maximum sensitivity in the ultraviolet range, the radiation source should furnish an effective amount of this radiation, preferably having a wavelength range between about 2500 Å and 5000 Å. Suitable sources of such radiation, in addition to sunlight, include carbon arcs, mercury-vapor arcs, fluorescent lamps with ultraviolet radiation-emitting phosphors, argon glow lamps, lasers, electron flash units and photographic flood lamps. Electron accelerators and electron beam sources through an appropriate mask may also be used. Of these, the mercury-vapor lamps, particularly the sun lamps, are most suitable.

The radiation exposure time may vary from fractions of a second to minutes, depending upon the intensity and spectral energy distribution of the radiation, its distance from the composition and the nature and amount of the composition available. Customarily, a mercury vapor arc or a sunlamp is used at a distance of about 1.5 to about 60 inches (3.8-153 cm) from the photosensitive composition. Exposure temperatures are preferably operated at about ambient temperatures or slightly higher, i.e., about 20° to about 35° C.

Development may be carried out at about 25° C., but best results are sometimes obtained when the developing solution is warm, e.g., 30° to 60° C. Development time can be varied, but it is preferably in the range of about 5 to 25 minutes. Developing solution may be applied in any convenient manner, including immersion, spraying and brush or roller application. Brushing aids in removing the unpolymerized or non-crosslinked portions of the composition. Washout is frequently carried out in an automatic processing unit which uses solvent and mechanical brushing action to remove the unexposed portions of the plate, leaving a relief constituting the exposed image and floor.

Preferred aqueous developers contain alkaline material. Suitable alkaline materials include alkali metal hydroxides. A preferred developer is 0.5% sodium hydroxide solution. Most preferred aqueous developers also contain a water miscible organic solvent in addition to the alkaline material. Suitable water miscible organic solvents include isopropanol, butanol, diacetone alcohol, 1-methoxyethanol, 2-ethoxyethanol, and 2-n-butyoxyethanol. Other aqueous developer combinations which can be employed are described in U.S. Pat. No. 3,796,602.

Following, solvent development, the relief printing plates are generally blotted or wiped dry, and then dried in a forced air or infrared oven. Drying times and temperatures vary, but drying for 60 to 120 minutes at 60° C. (140° F.) is typical. High temperatures are not recommended as shrinkage of the support may cause registration problems. Additional air drying overnight (16 hours or more) is common. Solvent will continue to evaporate from the printing relief during drying at ambient conditions.

Even after drying, however, photopolymer flexographic printing plates generally retain at least some degree of surface tackiness, particularly on the "shoulders" of the relief and other non-image areas. The surface tackiness is undesirable in a printing relief. It is common practice to employ one os several currently known detackification or "finishing" measures. For example, it is well known in the art that chemical treatment with either dilute aqueous chlorine or bromine, or exposure to short wavelength irradiation, can reduce this surface tackiness.

Satisfactory detackification of a photopolymer plate which has been developed in an aqueous or semiaqueous solution can be obtained by applying an aprotic organic solvent to the surface of the plate after drying and prior to exposing the printing surface to radiation with wavelengths in the range of 200 nm to 300 nm. This constitutes the subject matter of Applicant's assignee's E. I. du Pont de Nemours & Co.'s, co-pending patent application U.S. Ser. No. 096,694, which was filed on Sept. 14, 1987 and which is hereby incorporated by reference.

In addition to finishing to remove surface tackiness, most flexographic printing plates are uniformly post-exposed to ensure that the photocrosslinking process is complete and that the plate will remain stable during printing and storage. This "post-exposure" utilizes the same ultraviolet radiation source as the main exposure (usually wavelengths of 300 to 420 nm). Post-exposure is used to complete polymerization and maximize plate hardness and durability, but does not remove tackiness. Post-exposure can occur subsequently, simultaneously, and/or prior to light finishing.

The primary purpose of each exposure step is to affect polymerization, and actinic radiation from a variety of sources can be used, including commerical ultraviolet-fluorescent tubes, medium, high and low pressure mercury vapor lamps, argon glow lamps, electronic flash units, photographic flood lamps, pulsed xenon lamps, carbon arc lamps, etc. The radiation source must emit an effective amount of radiation having a wavelength in the range of 230 nm to 450 nm, preferably 300 to 420 nm, and more preferably, 340 to 400 nm. For efficient photopolymerization, the wavelength is matched to the absorption characteristics of the photoinitiator present in the photopolymerizable layers. A standard radiation source is the Sylvania 350 Blacklight fluorescent lamp (FR 48T12/350 VL/VHO/180, 115 w) which emits actinic radiation having a central wavelength around 354 nm. Exposure times vary from a few seconds to a few minutes, depending on the output of the lamps, distance from the lamps, relief depth desired, and the thickness of the plate.

The following examples serve to illustrate the practice of the invention. All percentages, ratios and parts are by weight unless otherwise indicated.

EXAMPLE 1

Example 1 illustrates the preparation of the plasticized release layer of the invention and preparation of a cover sheet using this release layer.

A 12 weight percent solution of polyvinyl alcohol was prepared by slowly adding 1260 grams of 88% hydrolyzed polyvinyl alcohol to 9240 grams deionized water. The solution was then heated to 90° C., held at that temperature for 30 minutes, and then cooled with stirring to room temperature.

To 1700 grams of the 12% polyvinyl alcohol solution was added slowly and with stirring:
36 grams polyethylene glycol, MW=1000
10.3 grams surfactant(a)

(a) Zonyl*FSN from the E. I. du Pont de Nemours & Co., Wilmington, Del.

This solution was stirred for an additional 30 minutes. It was then bar coated onto a 5 mil thick sheet of polyethylene terephthalate at a rate of 40 feet per minute to give a dry coating weight of 37 milligrams per square decimeter.

EXAMPLE 2

Example 2 illustrates use of the cover sheet prepared in Example 1 with a photosensitive flexographic plate composition.

The following ingredients were used to prepare the photopolymerizable composition:

| Ingredient | Parts by weight |
| --- | --- |
| Core/Shell microgel(b) | 37.4 |
| Ethylacrylate/acrylic acid copolymer (92/8) | 37.4 |
| Hexamethylene glycol diacrylate | 10.0 |
| Polyoxyethylated trimethylol propane triacrylate | 10.0 |
| Dimethoxy phenyl acetophenone | 4.0 |
| 2,6-dimethyl-4-t-butyl phenol | 1.0 |
| 1,4,4-trimethyl-2,3-diazobicyclo-(3.2.2.)-non-ene-2,3-dioxide | 0.05 |
| Hydroxyethyl methacrylate | 0.10 |
| Victoria Green dye | 0.01 |

(b)Microgel C from Table 1 was used. The core was 98 parts 2-ethylhexylacrylate, one part allylmethacrylate, one part 1,4-butylene glycol diacrylate; the shell was 80 parts n-butyl acrylate, 20 parts methacrylic acid; the ratio of core to shell was 2:1.

The above ingredients were fed into a 28 mm twin screw extruder and extruded between the cover sheet of Example 1 and a 5 mil polyethylene terephthalate support. The final plate thickness was 20 mils.

When the polyester layer was removed prior to imagewise exposure, the release layer remained on the photopolymer layer and exhibited a smooth surface.

The plate was then exposed for 2.5 minutes to a photographic negative on the Cyrel ® 3040 exposure unit (E. I. du Pont de Nemours & Co., Wilmington, Del.). It was then processed for 2 minutes in the Cyrel ® aqueous processor (E. I. du Pont de Nemours & Co., Wilmington, Del.) with a 0.5% aqueous solution of sodium hydroxide at 75° F., and dried for 20 minutes at 60° C. in the Cyrel ® Dryer (E. I. du Pont de Nemours & Co., Wilmington, Del.). The resulting plate exhibited a relief image with smooth surfaces on solid areas.

COMPARATIVE EXAMPLE 3

A cover sheet was prepared as in Example 1 except that the polyethylene glycol was omitted. A photopolymerizable composition was extruded between this cover sheet and a support of 5 mil polyethylene terephthalate as described in Example 2.

When the polyester layer was removed prior to imagewise exposure, the release layer remained on the photopolymer layer. However, the surface of the release layer was wrinkled.

EXAMPLE 4

Example 4 illustrates the use of the cover sheet in Example 1 with a photosensitive semi-aqueous flexographic plate composition:

| Ingredient | Parts by weight |
| --- | --- |
| Butadiene(70)acrylonitrile(27)-acrylic acid(3) copolymer | 81.6 |
| Hexamethylene glycol diacrylate | 10.0 |
| Polyester plasticizer | 5.0 |
| Dibutyl tin mercaptoacetate | 2.0 |
| 1,4,4-trimethyl-2,3-diazobicyclo-(3.2.2.)non-ene-2,3-dioxide | 0.05 |
| Dimethoxyphenylacetophenone | 1.25 |
| 2,6-dimethyl-4-t-butylphenol | 0.10 |
| Milling Blue BL dye | 0.01 |

The above ingredients were fed into an 83 mm twin screw extruder and extruded between a 5 mil polyethylene terephthalate cover sheet and support. The 5 mil cover sheet was coated with a thin (~42 mg/dm$^2$)polyamide release layer. The cover sheet was removed, and the polyamide layer removed with tape. The cover sheet described in Example 1 was then laminated to the photopolymer surface. When the polyester layer was removed prior to imagewise exposure, the release layer remained on the photopolymer layer and exhibited a smooth surface.

The plate was exposed through the back side for 100 seconds on the Cyrel ® 3040 exposure unit (E. I. du Pont de Nemours & Co., Wilmington, Del.). It was then exposed to a photographic negative for 10 minutes. It was then processed for 20 minutes in the Cyrel ® aqueous processor (E. I. du Pont de Nemours & Co., Wilmington, Del.) with a semi-aqueous solution consisting of 0.5% sodium hydroxide and 16% butyl carbitol at 60° C. The plate was then dried for 20 minutes in the Cyrel ® dryer (E. I. du Pont de Nemours & Co., Wilmington, Del.). The final plate exhibited a relief image with smooth surfaces on the solid areas.

What is claimed is:

1. An aqueous or semi-aqueous processible flexographic photosensitive element which comprises a support; a layer of a photosensitive composition; said composition comprising:

(a) an aqueous or semi-aqueous processible binder wherein the binder is a blend of a preformed macromolecular polymer and core shell microgel having less than 10% crosslinking in the core and an aqueous processible non-crosslinked shell consisting of an acid modified polymer;

(b) at least one addition polymerizable ethylenically unsaturated monomer;

(c) an initiator or initiating system activated by actinic radiation; and a flexible cover sheet, wherein said element has a release composition is interposed between the cover sheet and the photosensitive composition, said release composition comprising (1) at least 60% of a substantially hydrolyzed polyvinyl alcohol based on the total weight of the release composition and (2) at least 8% low molecular weight polyethylene glycol, based on the total weight of the release composition.

2. The element according to claim 1 wherein the weight ratio of the core to the shell is from about 4:1 to about 1:4.

3. The element according to claim 1 wherein the acid modified copolymer is a methacrylic acid modified n-butyl acrylate.

4. In a process for making a printing relief from a flexographic photosensitive element comprising:

(a) imagewise exposing selected portions of an aqueous or semi-aqueous processible photosensitive composition containing at least one ethylenically unsaturated photopolymerizable monomer; a photoinitiator or photoinitiating system activated by actinic radiation; and an aqueous or semi-aqueous processible binder;

(b) removing the unexposed portions; and (c) applying post development treatment;

wherein the improvement comprises using a binder which is a blend of a preformed macromolecular polymer and a core shell microgel having less than 10% crosslinking in the core and an aqueous processible non-crosslinked outer shell, said shell consisting of an acid-modified copolymer and applying a plasticized polyvinyl alcohol release composition to the photosensitive composition prior to imagewise exposing, said release composition comprising (1) at least 60% of a substantially hydrolyzed polyvinyl alcohol based on the total weight of the release composition; (2) at least 8% low molecular weight polyethylene glycol based on the total weight of the release composition.

5. The process of claim 4 wherein the weight ratio of the core to the shell is from about 4:1 to about 1:4.

* * * * *